(12) United States Patent
Okabe et al.

(10) Patent No.: US 12,211,692 B2
(45) Date of Patent: Jan. 28, 2025

(54) WAFER PROCESSING METHOD

(71) Applicant: Tokyo Electron Limited, Tokyo (JP)

(72) Inventors: Noriaki Okabe, Tokyo (JP); Takuya Seino, Tokyo (JP); Ryota Kozuka, Tokyo (JP); Yasuhiro Hamada, Yamanashi (JP); Yuutaro Kishi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 318 days.

(21) Appl. No.: 17/190,818

(22) Filed: Mar. 3, 2021

(65) Prior Publication Data
US 2021/0280419 A1    Sep. 9, 2021

(30) Foreign Application Priority Data

Mar. 6, 2020 (JP) ................................ 2020-039233

(51) Int. Cl.
*H01L 21/033* (2006.01)
*H01L 21/308* (2006.01)
*H01L 21/311* (2006.01)

(52) U.S. Cl.
CPC ...... *H01L 21/0332* (2013.01); *H01L 21/3081* (2013.01); *H01L 21/31116* (2013.01); *H01L 21/31144* (2013.01)

(58) Field of Classification Search
CPC ........... H01L 21/3081; H01L 21/31116; H01L 21/31144; H01L 21/76816; H01L 21/768; H01L 21/02189; H01L 21/02282
See application file for complete search history.

(56) References Cited

U.S. PATENT DOCUMENTS

| | | | | |
|---|---|---|---|---|
| 5,753,945 A * | 5/1998 | Chivukula | ............ | H01L 29/516 257/532 |
| 5,880,505 A * | 3/1999 | Fujii | ..................... | H01L 29/456 257/E21.507 |
| 9,659,811 B1 * | 5/2017 | Peng | ................. | H01L 21/76829 |
| 2008/0073681 A1 * | 3/2008 | Kanaya | .................. | H10B 53/00 257/E29.345 |
| 2009/0236656 A1 * | 9/2009 | Sung | .................... | H10B 12/488 257/329 |
| 2015/0047891 A1 * | 2/2015 | Lee | ................... | H01L 21/76877 174/250 |
| 2015/0056808 A1 * | 2/2015 | Ogasawara | ....... | H01L 21/31116 438/694 |

(Continued)

FOREIGN PATENT DOCUMENTS

| | | |
|---|---|---|
| CN | 109755126 A | 5/2019 |
| JP | H11-354517 A | 12/1999 |

(Continued)

*Primary Examiner* — Walter H Swanson
*Assistant Examiner* — Jacob T Nelson
(74) *Attorney, Agent, or Firm* — Armstrong Teasdale LLP

(57) ABSTRACT

A method of processing a wafer includes preparing a wafer having a substrate and a silicon-containing film formed on the substrate; forming a hard mask on the silicon-containing film; forming a pattern on the hard mask by etching the hard mask; and etching the silicon-containing film using the hard mask on which the pattern is formed, wherein the hard mask has a first film formed on the silicon-containing film and containing tungsten, and a second film formed on the first film and containing zirconium or titanium and oxygen.

17 Claims, 7 Drawing Sheets

(56) References Cited

U.S. PATENT DOCUMENTS

| | | | | |
|---|---|---|---|---|
| 2016/0333806 A1* | 11/2016 | Takayanagi | ............. | F02D 41/26 |
| 2019/0019675 A1 | 1/2019 | Lee et al. | | |
| 2019/0033672 A1* | 1/2019 | Ohori | .................. | H01L 27/1248 |
| 2019/0333806 A1* | 10/2019 | Huang | ................ | H01L 21/0332 |
| 2020/0098581 A1* | 3/2020 | Xu | ............................ | G03F 1/22 |

FOREIGN PATENT DOCUMENTS

| | | | |
|---|---|---|---|
| JP | 2003-243526 A | 8/2003 |
| JP | 2005-150403 A | 6/2005 |
| JP | 2007-294836 A | 11/2007 |
| JP | 2012-069803 A | 4/2012 |
| JP | 2016-192522 A | 11/2016 |
| TW | 200623211 A | 7/2006 |
| TW | 201145501 A | 12/2011 |
| TW | 201435502 A | 9/2014 |

* cited by examiner

WAFER PROCESSING METHOD

CROSS-REFERENCE TO RELATED APPLICATION

This application is based upon and claims the benefit of priority from Japanese Patent Application No. 2020-039233, filed on Mar. 6, 2020, the entire contents of which are incorporated herein by reference.

TECHNICAL FIELD

An exemplary embodiment of the present disclosure relates to a wafer processing method.

BACKGROUND

In the manufacture of electronic devices such as semiconductor devices, plasma etching may be performed on a silicon-containing film in order to form openings such as holes or grooves in the silicon-containing film. A mask is formed on the silicon-containing film to form such openings. A resist mask is known as the mask.

In recent years, elements in electronic devices are configured to have a three-dimensional structure. Along with this, considerably deep openings are formed in the silicon-containing film. However, the resist mask is consumed substantially during the plasma etching of the silicon-containing film. Therefore, a hard mask is required to be used. As the hard mask, as disclosed in Patent Documents 1 to 4, a hard mask formed from tungsten silicide or titanium nitride (TiN) is used.

RELATED ART DOCUMENTS

Patent Documents

Patent Document 1: Japanese Laid-open Publication No. 2007-294836
Patent Document 2: Japanese Laid-open Publication No. 2003-243526
Patent Document 3: Japanese Laid-open Publication No. 2005-150403
Patent Document 4: U.S. Patent Application Publication No. 2019/0019675

SUMMARY

According to one embodiment of the present disclosure, a method of processing a wafer is provided. The method includes: preparing a wafer having a substrate and a silicon-containing film formed on the substrate; forming a hard mask on the silicon-containing film; forming a patterned mask by etching the hard mask; and etching the silicon-containing film using the patterned hard mask, wherein the hard mask has a first film formed on the silicon-containing film and containing tungsten, and a second film formed on the first film and containing zirconium or titanium and oxygen.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
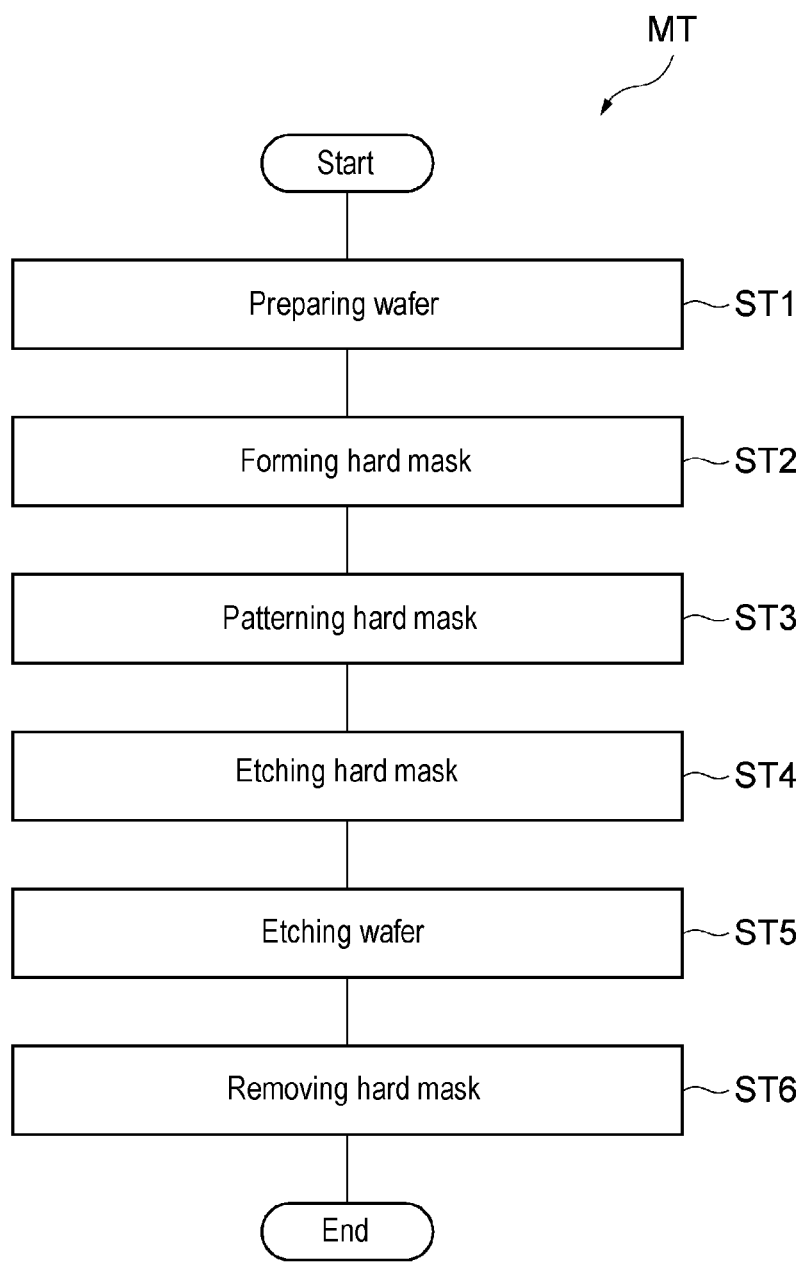
FIG. 1 is a flowchart showing a wafer processing method according to an exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In recent years, with the increase in speed and density of electronic devices, it has become difficult to process fine patterns. In particular, in the formation of a capacitor of a memory device (e.g. DRAM), processing of 50 or more aspect ratio (A/R) having a critical dimension (CD) of 20 nm or less and a depth of 1.0 µm or more is required.

Currently, amorphous silicon is used for a hard mask to etch a silicon-containing film. The amorphous silicon is etched using, for example, a hard mask of silicon oxide. As the A/R increases, the amorphous silicon hard mask is required to be thickened. As the amorphous silicon hard mask becomes thicker, the silicon oxide hard mask for etching the amorphous silicon is also required to be thickened. As the thickness of the hard mask increases, the vertical incidence of ions is suppressed, so that twisting is likely to occur. Therefore, a hard mask having higher resistance to plasma etching than the amorphous silicon is required when etching the silicon-containing film. Further, a hard mask used when etching the hard mask having high resistance to the plasma etching is also required to have high resistance to the plasma etching as well.

Hereinafter, various exemplary embodiments will be described. In one exemplary embodiment, a method of processing a wafer is provided. The method includes preparing a wafer having a substrate and a silicon-containing film formed on the substrate. The method further includes forming a hard mask on the silicon-containing film. The method includes forming a pattern on the hard mask by etching the hard mask. The method further includes etching the silicon-containing film using the hard mask on which the pattern is formed. The hard mask has a first film formed on the silicon-containing film and containing tungsten, and a second film formed on the first film and containing zirconium or titanium and oxygen.

In another exemplary embodiment, a method of processing a wafer is provided. The method includes preparing a wafer having a substrate and a silicon-containing film formed on the substrate. The method further includes forming a first film containing tungsten on the silicon-containing film. The method further includes forming a second film containing zirconium or titanium and oxygen on the first film. The method further includes forming a pattern on the first film by etching the first film using the second film as a mask. The method further includes etching the silicon-containing film using the first film, on which the pattern is formed, as a mask.

In one exemplary embodiment described above, the hard mask in which the first film containing tungsten is formed on the silicon-containing film and the second film containing zirconium or titanium is formed on the first film is used to etch the silicon-containing film. The second film containing zirconium or titanium has sufficiently high etching resistance as compared with the first film containing tungsten. Therefore, in pattern formation on the hard mask having the first film and the second film, the shape abnormality of the pattern is sufficiently suppressed. Therefore, the shape abnormality of the pattern formed on the silicon-containing film by etching the silicon-containing film using the first film (further, the hard mask), on which the pattern in which the shape abnormality is sufficiently suppressed is formed, is also sufficiently suppressed. Therefore, even when the pattern formed on the silicon-containing film has a high aspect ratio, twisting and the like can be suppressed and the pattern can be sufficiently good.

In one exemplary embodiment, forming the first film may include forming the first film on the silicon-containing film by sputtering.

In one exemplary embodiment, forming the first film may include forming the first film on the silicon-containing film by a chemical vapor deposition method.

In one exemplary embodiment, forming the second film may include forming the second film on the first film by a coating process.

In one exemplary embodiment, the coating process may be a spin coating process.

In one exemplary embodiment, forming the second film may include forming the second film on the first film by a chemical vapor deposition method or an atomic layer deposition method.

In one exemplary embodiment, the etching of the second film performed in forming the pattern on the second film may be anisotropic etching using plasma of a gas containing halogen atoms. The etching of the first film performed in forming the pattern on the first film may be anisotropic etching using the plasma of the gas containing halogen atoms.

In one exemplary embodiment, each of the first film and the second film may be an amorphous film.

In one exemplary embodiment, the first film may further contain silicon.

In one exemplary embodiment, the etching of the silicon-containing film performed in etching the silicon-containing film may be anisotropic etching using plasma of a fluorocarbon-based gas or plasma of a hydrofluorocarbon-based gas.

In one exemplary embodiment, the silicon-containing film may be a monolayer film having one of a single crystal silicon film, a polycrystalline silicon film, a silicon oxide film, and a silicon nitride film, or a multilayer film having two or more of the single crystal silicon film, the polycrystalline silicon film, the silicon oxide film, and the silicon nitride.

Various exemplary embodiments will now be described in detail with reference to the drawings. Throughout the drawings, the same or corresponding parts will be denoted by the same reference numerals.

Figure 2:
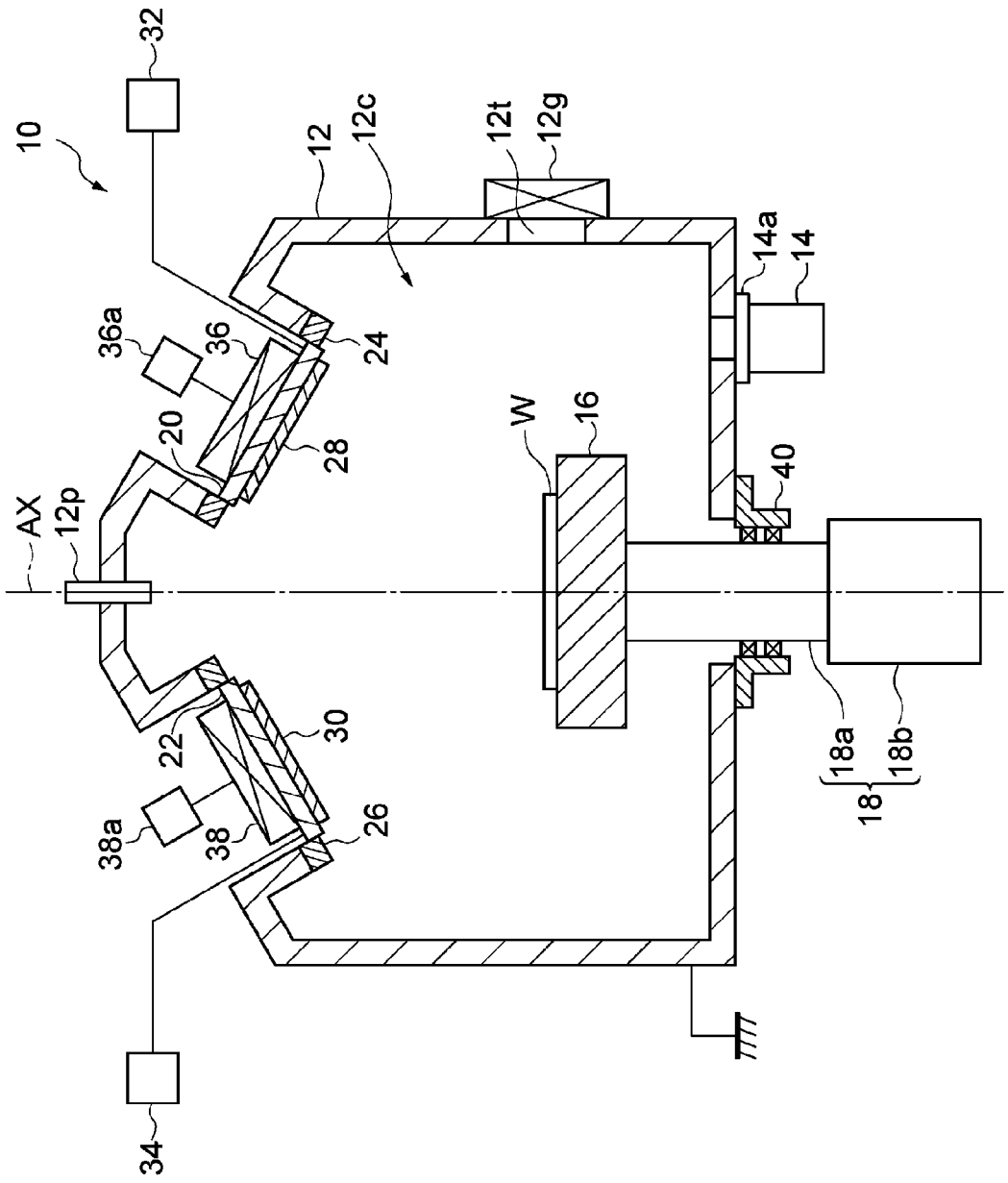
FIG. 2 is a view showing an example of a configuration of a film forming apparatus that can be used to perform the method shown in FIG. 1.
Figure 3:
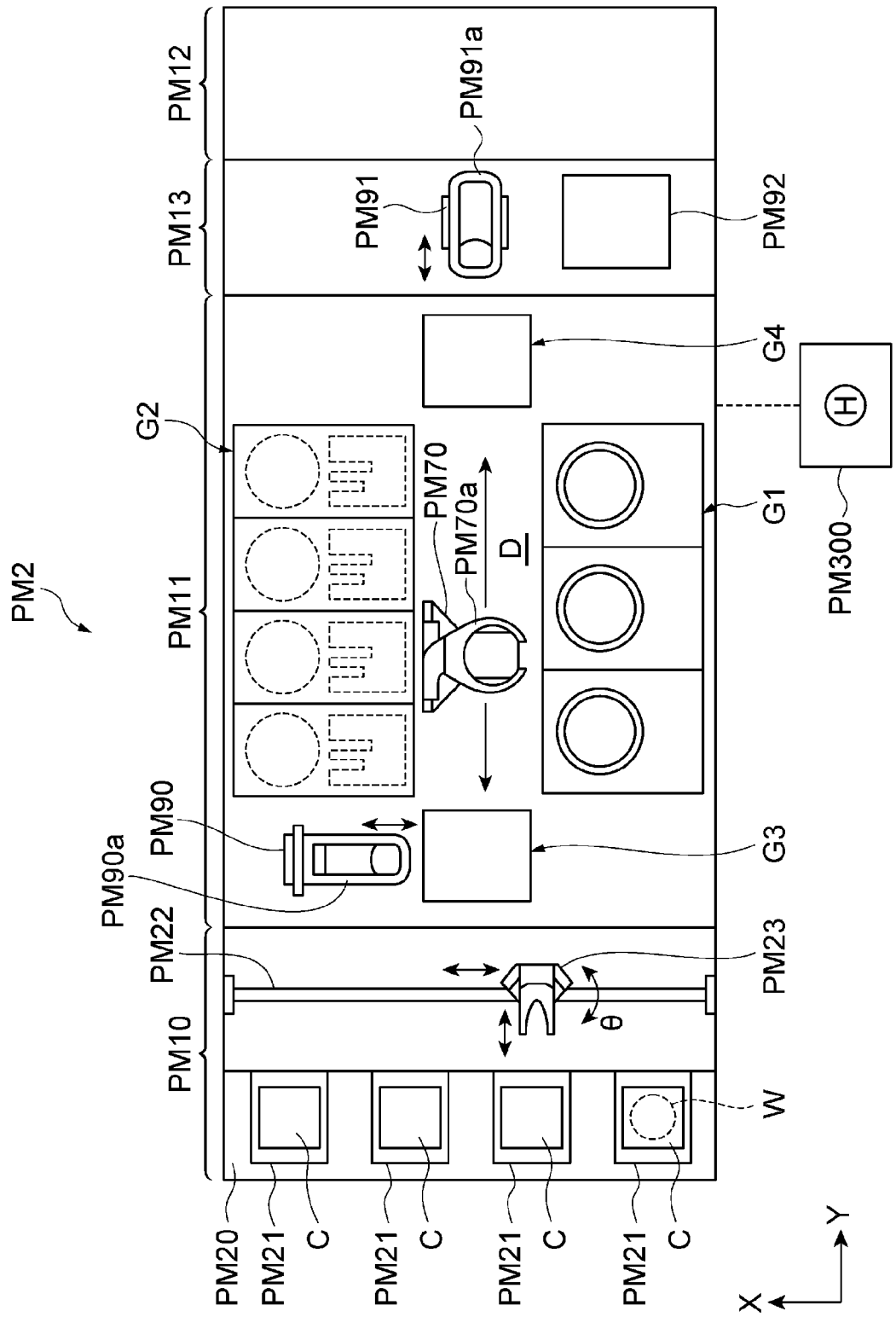
FIG. 3 is a view showing an example of a configuration of a coating apparatus that can be used to perform the method shown in FIG. 1.
Figure 4:
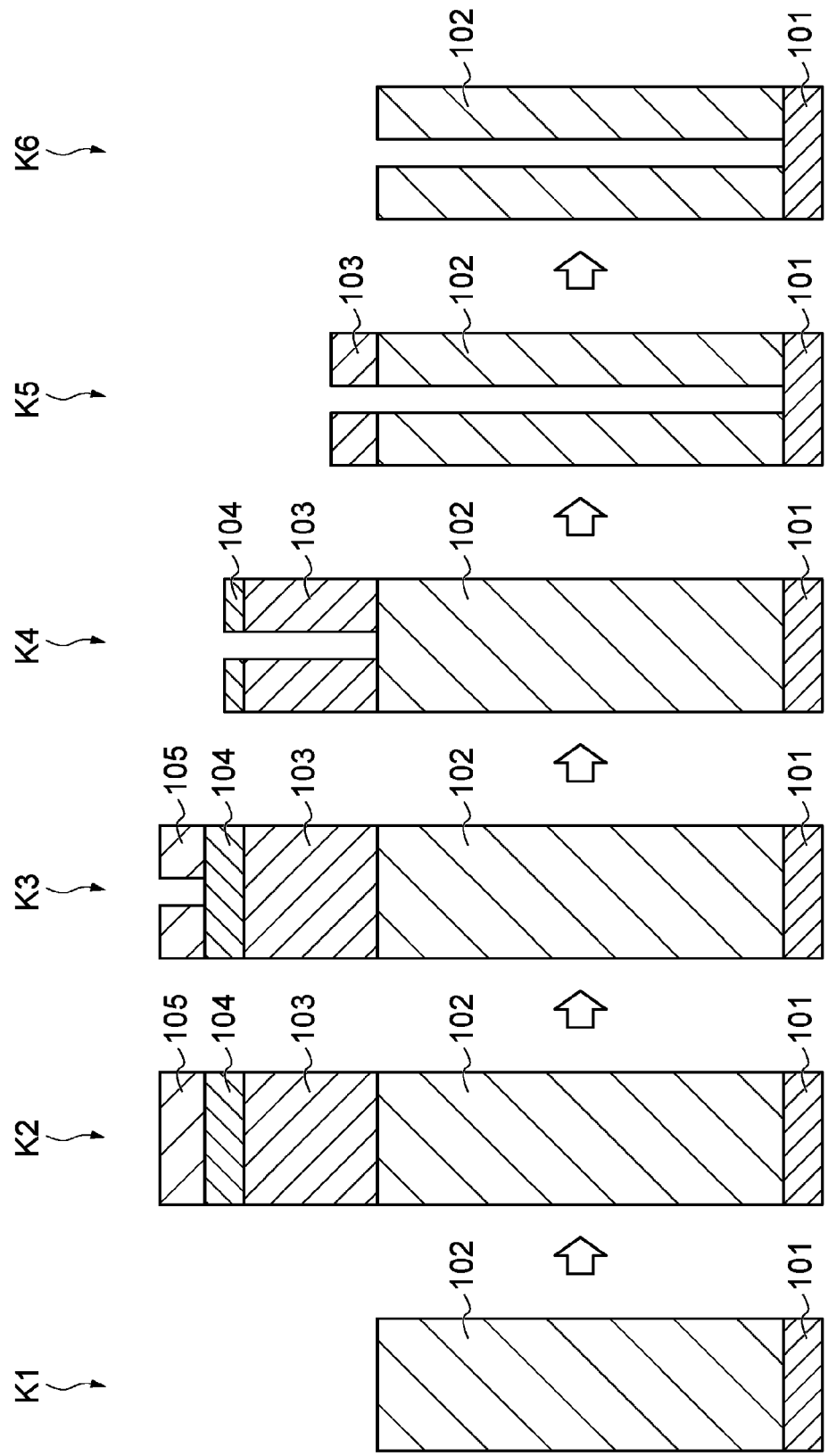
FIG. 4 is a view showing a plurality of states of a wafer that can be implemented with performance of the method shown in FIG. 1.

Hereinafter, one exemplary embodiment of a wafer processing method will be described with reference to FIGS. 1 to 4. FIG. 1 is a flowchart showing a wafer processing method (referred to as "method MT") according to one exemplary embodiment. FIG. 2 is a view showing an example of a configuration of a film forming apparatus that can be used to perform the method MT shown in FIG. 1. FIG. 3 is a view showing an example of a configuration of a coating apparatus that can be used to perform the method MT shown in FIG. 1. FIG. 4 is a view showing a plurality of states of a wafer W that can be implemented with performance of the method MT shown in FIG. 1.

First, a configuration of a film forming apparatus 10 according to one exemplary embodiment will be described with reference to FIG. 2. The film forming apparatus 10 shown in FIG. 2 is an apparatus for forming a film by sputtering. The film forming apparatus 10 includes a chamber body 12. The chamber body 12 has a substantially tubular shape. The chamber body 12 has an internal space functioning as a chamber 12c. The chamber body 12 is made of a conductor such as aluminum. The chamber body 12 is connected to a ground electric potential.

An exhaust device 14 for depressurizing the chamber 12c is connected to a bottom portion of the chamber body 12 via an adapter 14a. The exhaust device 14 includes a pressure controller, and a decompression pump such as a dry pump and/or a turbo molecular pump. Further, an opening 12t is formed in a sidewall of the chamber body 12 for loading the wafer W into the chamber 12c and unloading the wafer W from the chamber 12c therethrough. The opening 12t can be opened or closed by a gate valve 12g.

A port 12p is formed in the chamber body 12. The port 12p provides a flow path for introducing a gas into the chamber body 12. A gas supply part is connected to the port 12p. A gas is supplied from the gas supply part into the chamber 12c via the port 12p. The gas supplied into the chamber 12c may be an inert gas such as a noble gas or a nitrogen gas.

A stage 16 is provided inside the chamber 12c. The stage 16 is configured to support the wafer W placed on the stage 16. The stage 16 may include an electrostatic chuck that holds the wafer W. Further, the stage 16 may include a temperature adjusting mechanism such as a heater.

The stage 16 is connected to a drive mechanism 18. The drive mechanism 18 includes a support shaft 18a and a drive device 18b. The support shaft 18a extends from immediately below the stage 16 outward of the chamber body 12 through a bottom portion of the chamber body 12. A central axis line of the support shaft 18a coincides with an axis line AX extending in a vertical direction. A sealing member 40 is provided between the support shaft 18a and the bottom portion of the chamber body 12. The sealing member 40 is configured to seal a space between the bottom portion of the chamber body 12 and the support shaft 18a so that the support shaft 18a is rotatable and movable up and down. The sealing member 40 may be, for example, a magnetic fluid seal.

The stage 16 is connected to one end of the support shaft 18a, and the drive device 18b is connected to the other end of the support shaft 18a. The drive device 18b is configured to generate a driving force for rotating and moving the support shaft 18a up and down. The stage 16 is configured to rotate around the axis line AX when the support shaft 18a rotates, and to move up and down as the support shaft 18a moves up and down.

A holder 20 and a holder 22 are attached to ceiling portions of the chamber body 12. The holder 20 and the holder 22 are made of metal. The holder 20 is supported on a ceiling portion of the chamber body 12 via an insulating member 24. The holder 22 is supported on a ceiling portion of the chamber body 12 via an insulating member 26. The holder 20 holds a target 28 (first target), and the holder 22 holds a target 30 (second target).

The holder 20 and the holder 22 hold the target 28 and the target 30, respectively, so that the target 28 and the target 30 are arranged in a substantially symmetrical relationship with respect to a virtual plane including the axis line AX. Further, the holder 20 and the holder 22 hold the target 28 and the target 30, respectively, so that the target 28 and the target 30 are inclined close to the axis line AX as they move upward.

A power supply 32 is electrically connected to the holder 20. The power supply 32 is configured to generate a voltage to be applied to the holder 20. The voltage from the power supply 32 is applied to the target 28 via the holder 20. The power supply 32 may be a DC power supply or a radio frequency power supply. When the power supply 32 is a radio frequency power supply, the power supply 32 is connected to the holder 20 via a matcher for bringing a load impedance close to a matching point, or matching the load impedance to the matching point.

A power supply 34 is electrically connected to the holder 22. The power supply 34 is configured to generate a voltage to be applied to the holder 22. The voltage from the power supply 34 is applied to the target 30 via the holder 22. The power supply 34 may be a DC power supply or a radio frequency power supply. When the power supply 34 is a radio frequency power supply, the power supply 34 is connected to the holder 22 via a matcher for bringing a load impedance close to a matching point, or matching the load impedance to the matching point.

The film forming apparatus 10 may further include a cathode magnet 36 and a cathode magnet 38. The cathode magnet 36 is provided on the outside of the chamber body 12 so as to face the target 28 via the holder 20. The cathode magnet 38 is provided on the outside of the chamber body 12 so as to face the target 30 via the holder 22. A magnet driving part 36a and a magnet driving part 38a are connected to the cathode magnet 36 and the cathode magnet 38, respectively.

When forming a film by the film forming apparatus 10, the wafer W is loaded into the chamber body 12, and is placed on the stage 16 to be supported by the stage 16. Then, the position of the stage 16 in the vertical direction is adjusted by the drive mechanism 18, and the stage 16 is rotated around the axis line AX. The rotation of the stage 16 continues during the film formation.

Subsequently, a gas is supplied from the gas supply part into the chamber 12c, and the chamber 12c is depressurized by the exhaust device 14. Then, the voltages are applied to the target 28 and the target 30 by the power supply 32 and the power supply 34, respectively. Further, the cathode magnet 36 and the cathode magnet 38 are driven by the magnet driving part 36a and the magnet driving part 38a, respectively. As a result, plasma is concentrated in the vicinity of the target 28 and the target 30.

Then, when positive ions in the plasma collide with the target 28 and the target 30, constituent substances are released from each of the target 28 and the target 30. The released constituent substances are deposited on the wafer W. As a result, a film is formed on the wafer W.

In one embodiment, each of the target 28 and the target 30 can be a target containing tungsten and silicon. In the target 28 and the target 30 of this embodiment, the concentration of tungsten and the concentration of silicon are adjusted so that the film formed on the wafer W is an amorphous film containing tungsten and silicon.

When the target used in the film forming apparatus 10 is a target containing tungsten and silicon, at least one of the target 28 and the target 30 may be used for film formation. When only one of the target 28 and the target 30 is used for film formation, the voltage is applied only to the holder holding the respective target. Further, only the cathode magnet corresponding to the respective target is driven by the respective magnet driving part.

In another embodiment, the target 28 is made of tungsten and the target 30 is made of silicon. In this embodiment, both the target 28 and the target 30 are used for film formation. Further, the voltage to be applied to the target 28 and the voltage to be applied to the target 30 are adjusted so that an amorphous film containing tungsten and silicon is formed on the wafer W.

Next, a configuration of a coating apparatus PM2 according to one exemplary embodiment will be described with reference to FIG. 3. The coating apparatus PM2 includes a cassette station PM10, a processing station PM11, and an interface station PM13. The coating apparatus PM2 may have a configuration in which the cassette station PM10, the processing station PM11, and the interface station PM13 are integrally connected.

The cassette station PM10 is configured so as to load and unload a cassette C, in which a plurality of wafers W is accommodated, thereinto and therefrom. The processing station PM11 includes a plurality of various processing devices configured so as to perform a predetermined process on the wafer W. The interface station PM13 is configured so as to transfer the wafer W to and from an exposure apparatus PM12 provided adjacent to the processing station PM11.

A cassette placement table PM20 is provided in the cassette station PM10. The cassette placement table PM20 is provided with a plurality of cassette placement plates PM21, on which cassettes C are mounted and which are used when the cassettes C are loaded into and out of the coating apparatus PM2.

As shown in FIG. 3, a wafer transfer device PM23 is provided in the cassette station PM10 to be movable on a transfer path PM22 extending in the X-direction. The wafer transfer device PM23 is also movable in a vertical direction and around a vertical axis (in a θ direction). The wafer transfer device PM23 is configured to be able to transfer the wafer W between the cassette C on each cassette placement plate PM21 and a delivery device of a third block G3 of the processing station PM11 to be described later.

A plurality of blocks, for example, four blocks (first block G1, second block G2, third block G3, and fourth block G4), which are provided with various types of devices, are provided in the processing station PM11. For example, the first block G1 is provided on the front side (the side in the negative X-direction in FIG. 3) of the processing station PM11. The second block G2 is provided on the back side (the side in a positive X-direction in FIG. 3) of the processing station PM11. Further, the third block G3 is provided on the cassette station PM10 side (the side in the negative Y-direction in FIG. 3) of the processing station PM11. The fourth block G4 is provided on the interface station PM13 side (the side in the positive Y-direction in FIG. 3) of the processing station PM11.

A plurality of liquid treatment devices is provided in the first block G1. Each of the plurality of liquid treatment devices may be, for example, a developing device, an organic solvent supply device, an antireflection film forming device, a neutral layer forming device, a resist coating device, a block copolymer coating device, or the like. For example, the developing device, the organic solvent supply device, the antireflection film forming device, the neutral layer forming device, the resist coating device, and the block copolymer coating device are arranged so as to be stacked in the named order from the bottom. For example, the developing device, the organic solvent supply device, the antireflection film forming device, the neutral layer forming device, the resist coating device, and the block copolymer coating device are arranged side by side and three by three in a horizontal direction, respectively. The number and arrangement of liquid treatment devices may be arbitrarily selected.

The developing device is configured so as to develop the wafer W. The organic solvent supply device is used as a polymer removing device configured so as to supply an organic solvent onto the wafer W. The antireflection film forming device is configured so as to form an antireflection film on the wafer W. The neutral layer forming device is configured so as to apply a neutral agent on the wafer W to form a neutral layer. The resist coating device is configured so as to coat the wafer W with a resist liquid to form a resist film. The block copolymer coating device is configured so as to coat the wafer W with a block copolymer.

In the above liquid treatment device, a spin coating process of coating the wafer W with a preset coating liquid is performed. In the spin coating process, for example, the coating liquid is discharged onto the wafer W from a coating nozzle and the wafer W is rotated by a coater so that the coating liquid diffuses on the surface of the wafer W.

In the second block G2, a heat treatment device, an ultraviolet irradiation device, an adherence device, a peripheral exposure device, and a polymer separation device are provided side by side in the vertical direction and the horizontal direction. The number and arrangement of heat treatment devices, ultraviolet irradiation devices, adherence devices, peripheral exposure devices, and polymer separation devices may be arbitrarily selected.

The heat treatment device is configured so as to thermally treat the wafer W. The heat treatment device includes a hot plate that heats the wafer W placed thereon, and a cooling plate that cools down the wafer W placed thereon, and is configured so as to perform both heating treatment and cooling treatment.

The ultraviolet irradiation device is configured so as to irradiate the wafer W with an ultraviolet ray. The adherence device is configured so as to hydrophobize the wafer W. The peripheral exposure device is configured so as to expose the outer peripheral portion of the wafer W. The polymer separation device is configured so as to phase-separate a block copolymer coated on the wafer W with the block copolymer coating device into a hydrophilic polymer and a hydrophobic polymer.

In the third block G3, a plurality of delivery devices is provided sequentially from the bottom. In the fourth block G4, a plurality of delivery devices is provided sequentially from the bottom.

A wafer transfer region D is formed in a region surrounded by the first block G1 to the fourth block G4. A plurality of wafer transfer devices PM70 is arranged in the wafer transfer region D.

Each of the plurality of wafer transfer devices PM70 moves inside the wafer transfer region D and is configured so as to transfer the wafer W to a predetermined device of the first block G1, the second block G2, the third block G3, and the fourth block G4 arranged around the wafer transfer device PM70. Each of the plurality of wafer transfer devices PM70 has a transfer arm PM70a. The transfer arm PM70a is configured so as to be movable in, for example, the Y-direction, the X-direction, the θ-direction, and the vertical direction.

As shown in FIG. 3, a wafer transfer device PM90 is provided adjacent to the third block G3 in the positive X-direction. The wafer transfer device PM90 has, for example, a transfer arm PM90a configured so as to be movable in the X-direction, the θ-direction, and the vertical direction. The wafer transfer device PM90 is configured so as to be movable up and down while supporting the wafer W and to be able to transfer the wafer W to each transfer device inside the third block G3.

A wafer transfer device PM91 and a delivery device PM92 are provided in the interface station PM13. The wafer transfer device PM91 has, for example, a transfer arm PM91a configured so as to be movable in the Y-direction, the θ-direction, and the vertical direction. For example, the wafer transfer device PM91 is configured so as to be able to support the wafer W by the transfer arm PM91a and to be able to transfer the wafer W between each delivery device and the transfer device PM92 of the fourth block G4, and the exposure apparatus PM12.

A controller PM300 is connected to the coating apparatus PM2 and the film forming apparatus 10. The controller PM300 is, for example, a computer, and has a program storage part (not shown). A computer program that entirely controls the coating apparatus PM2 and the film forming apparatus 10 is stored in the program storage part. A computer program for implementing the method MT shown in FIG. 1 is stored in the program storage part.

Such a computer program may be recorded in a non-transitory computer-readable storage medium such as a hard disk, a flexible disk, a compact disc, a magneto-optical disc, a memory card, or the like. In this case, the computer program recorded in the recording medium may be installed and used in the controller PM300 from the storage medium.

The method MT will be described in detail with reference to FIG. 1 again. The method MT includes steps ST1 to ST6. In step ST1, a wafer W in a state K1 shown in FIG. 4 is prepared. The Wafer W in the state K1 has a substrate 101 and a silicon-containing film 102. The silicon-containing film 102 is formed on the substrate 101. Although the silicon-containing film 102 is formed in contact with the substrate 101 in FIG. 4, another film having, for example, conductivity or insulating property may be formed between the substrate 101 and the silicon-containing film 102. The silicon-containing film 102 may be a monolayer film having one of a single crystal silicon film, a polycrystalline silicon film, a silicon oxide film, and a silicon nitride film, or a multilayer film having two or more of these films.

In the subsequent step ST2, a hard mask is formed on the silicon-containing film 102, as in the wafer W in the state K2 shown in FIG. 4. This hard mask has a first hard mask 103 (first film) and a second hard mask 104 (second film) formed on the first hard mask 103. More specifically, in step ST2, the first hard mask 103 and the second hard mask 104 are sequentially formed on the silicon-containing film 102. In step ST2, a carbon-containing film 105 may be further formed on the second hard mask 104.

In step ST2, first, the first hard mask 103 is formed on the silicon-containing film 102. The first hard mask 103 is a hard mask for plasma etching on the silicon-containing film 102. The plasma etching may be dry etching (anisotropic reactive ion etching) using plasma of a halogen-based gas. The first hard mask 103 has high resistance to plasma etching (step ST4 to be described later).

The first hard mask 103 contains tungsten (W) and silicon (Si). The first hard mask 103 is an amorphous film containing W and Si. For example, the first hard mask 103 contains WSi. The concentration of tungsten in the first hard mask 103 falls within a range in which an amorphous state is maintained so that heat resistance (crystallization resistance) can be implemented. The film thickness of the first hard mask 103 may be in a range of 300 to 400 nm, but may be set depending on the film thickness and the etching selectivity of the silicon-containing film 102.

Since the first hard mask 103 has high resistance to plasma etching (step ST4), the film thickness of the first hard mask 103 can be made thinner and twisting of the first hard mask 103 can be reduced.

The film formation of the first hard mask 103 can be performed by, for example, sputtering. For the film formation of the first hard mask 103, the film forming apparatus 10 may be used and sputtering or co-sputtering using a single target or a plurality of targets may be used. In the case of co-sputtering, the concentration of tungsten may be set arbitrarily.

When the first hard mask 103 contains WSi, the material used for the film formation of the first hard mask 103 by sputtering may be WSi in the case of a single system, and may be W and Si in the case of a binary system. A temperature used for the film formation of the first hard mask 103 by sputtering may be room temperature. When the sputtering is used for the film formation of the first hard mask 103, the concentration of tungsten and the crystallinity may be well controlled, and impurities may be reduced.

In addition, a chemical vapor deposition (CVD) method may also be used for the film formation of the first hard mask 103. In this case, the first hard mask 103 may be formed by vapor phase growth by heat or plasma. In the film formation of the first hard mask 103 by the CVD method, the concentration of tungsten may be arbitrarily set by adjusting a mixing ratio of gases used for the film formation.

After the film formation of the first hard mask 103, the second hard mask 104 is formed in step ST2. Through step ST2, the second hard mask 104 is formed on the first hard mask 103.

The second hard mask 104 is a hard mask for plasma etching with respect to the first hard mask 103. The plasma etching may be dry etching (anisotropic reactive ion etching) using plasma of a halogen-based gas.

The second hard mask 104 has high resistance to plasma etching (step ST4 to be described later). The second hard mask 104 contains zirconium (Zr) or titanium (Ti) and oxygen (O). The second hard mask 104 is an amorphous film containing Zr or Ti and oxygen. For example, the second hard mask 104 may be zirconium oxide or titanium oxide. The concentration of Zr or Ti in the second hard mask 104 falls within a range in which an amorphous state is maintained so that heat resistance (crystallization resistance) can be implemented. A film thickness of the second hard mask 104 may be in a range of 30 to 200 nm, but may be set depending on the film thickness and the etching selectivity of the first hard mask 103.

The second hard mask 104 is formed on the first hard mask 103 by a coating process. More specifically, the formation (film formation) process of the second hard mask 104 may be performed by, for example, a spin coating process. The coating apparatus PM2 is used for the film formation of the second hard mask 104.

A material used for the film formation of the second hard mask 104 by the spin coating process contains a metal oxide carboxylate containing Zr or Ti, and an organic solvent. Examples of the organic solvent may include ethers, esters, ether esters, ketones, ketone esters, and the like.

A temperature (drying temperature) used for the film formation of the second hard mask 104 by the spin coating process may be in a range of 200 to 400 degrees Celsius. The temperature used for the film formation of the second hard mask 104 by the spin coating process may be set to a temperature range in which the first hard mask 103 and the second hard mask 104 are not crystallized (the amorphous state is maintained).

When the spin coating process is used for the film formation of the second hard mask 104, the process is performed by an apparatus of non-vacuum system. Thus, the film formation process becomes easier than when it is performed by an apparatus of a vacuum system, so that costs can be reduced.

In addition, a CVD method or an atomic layer deposition (ALD) method may be used for the film formation of the second hard mask 104. In this case, the second hard mask 104 may be formed by vapor phase growth by heat or plasma, or interfacial growth.

In step ST2, the carbon-containing film 105 is formed after the film formation of the second hard mask 104. Through step ST2, the carbon-containing film 105 is formed on the second hard mask 104.

The carbon-containing film 105 may function as a mask for plasma etching with respect to the first hard mask 103 and the second hard mask 104. A film thickness of the carbon-containing film 105 may be set according to the film thickness of the first hard mask 103 and the second hard mask 104, which may be in a range of 200 to 300 nm, and the etching selectivity of the first hard mask 103 and the second hard mask 104.

The film formation of the carbon-containing film 105 may be implemented by, for example, a spin coating process. For example, the coating apparatus PM2 is used for the film formation of the carbon-containing film 105. A temperature (drying temperature) used for the film formation of the carbon-containing film 105 by the spin coating process may be in a range of 400 to 600 degrees Celsius. The temperature (drying temperature) used for the film formation of the carbon-containing film 105 by the spin coating process may be set in a temperature range in which the first hard mask 103 and the second hard mask 104 are not crystallized (the amorphous state is maintained).

In the subsequent step ST3, a pattern to be transferred onto the silicon-containing film 102 is formed on the carbon-containing film 105, as in the wafer W in a state K3 shown in FIG. 4. The pattern may be a hole or groove.

In the subsequent step ST4, the first hard mask 103 and the second hard mask 104 are etched according to the pattern formed on the carbon-containing film 105, as in the wafer W in a state K4 shown in FIG. 4.

In step ST4, an etching apparatus (not shown) is used. In step ST4, first, the second hard mask 104 is etched. More specifically, in step ST4, the second hard mask 104 is etched using, as a mask, the carbon-containing film 105 on which the pattern to be transferred onto the silicon-containing film 102 is formed, so that the pattern is formed on the second hard mask 104.

The etching on the second hard mask 104 is anisotropic etching using plasma of a gas containing halogen atoms. More specifically, the etching on the second hard mask 104 may be anisotropic reactive ion etching using plasma of a $Cl_2$ gas, a $BCl_3$ gas, or the like.

In step ST4, the first hard mask 103 is then etched. More specifically, in step ST4, the first hard mask 103 is etched using, as a mask, the second hard mask 104 on which the pattern to be transferred onto the silicon-containing film 102 is formed, so that the pattern is formed on the first hard mask 103.

The etching on the first hard mask 103 is anisotropic etching using plasma of a gas containing halogen atoms. More specifically, the etching on the first hard mask 103 may be anisotropic reactive ion etching using plasma such as a $Cl_2$ gas or the like. At the end of step ST4, the second hard mask 104 may remain, but the second hard mask 104 may be completely removed.

In the subsequent step ST5, the silicon-containing film 102 is etched using a hard mask, as in the wafer W in a state K5 shown in FIG. 4. In step ST5, an etching apparatus (not shown) is used. More specifically, in step ST5, the silicon-containing film 102 is etched using, as a mask, the first hard mask 103 on which the pattern to be transferred onto the silicon-containing film 102 is formed (and may further include the second hard mask 104). As a result, the pattern is formed on the silicon-containing film 102. Accordingly, in step ST5, a hole or groove reaching the substrate 101 may be formed in the silicon-containing film 102. At the end of step ST5, only the first hard mask 103 may remain.

The etching on the silicon-containing film 102, which is performed in step ST5, may be anisotropic reactive ion etching using plasma of a fluorocarbon-based gas (for example, a $C_4F_6$ gas) or a hydrofluorocarbon-based gas (for example, a $CH_2F_2$ gas).

In the subsequent step ST6, the first hard mask 103 is removed, as in the wafer W in a state K6 shown in FIG. 4. If the second hard mask 104 remains at the end of step ST5, both the first hard mask 103 and the second hard mask 104 are removed in step ST6.

The process of removing the first hard mask 103, which is performed in step ST6, may be performed by spin cleaning. In this case, an ammonia peroxide mixture (APM) liquid, a hydrofluoric acid-hydrogen peroxide mixture (FPM) liquid, or the like may be used as a chemical liquid. A temperature (cleaning temperature) in step ST6 may be in a range of room temperature to 70 degrees Celsius.

An experiment conducted for evaluation of the second hard mask 104 will be described below. In this experiment, a plurality of hard masks having the same configuration as the second hard mask 104 was formed, and the surfaces of the plurality of hard masks were analyzed by an X-ray diffraction method.

Figure 5:
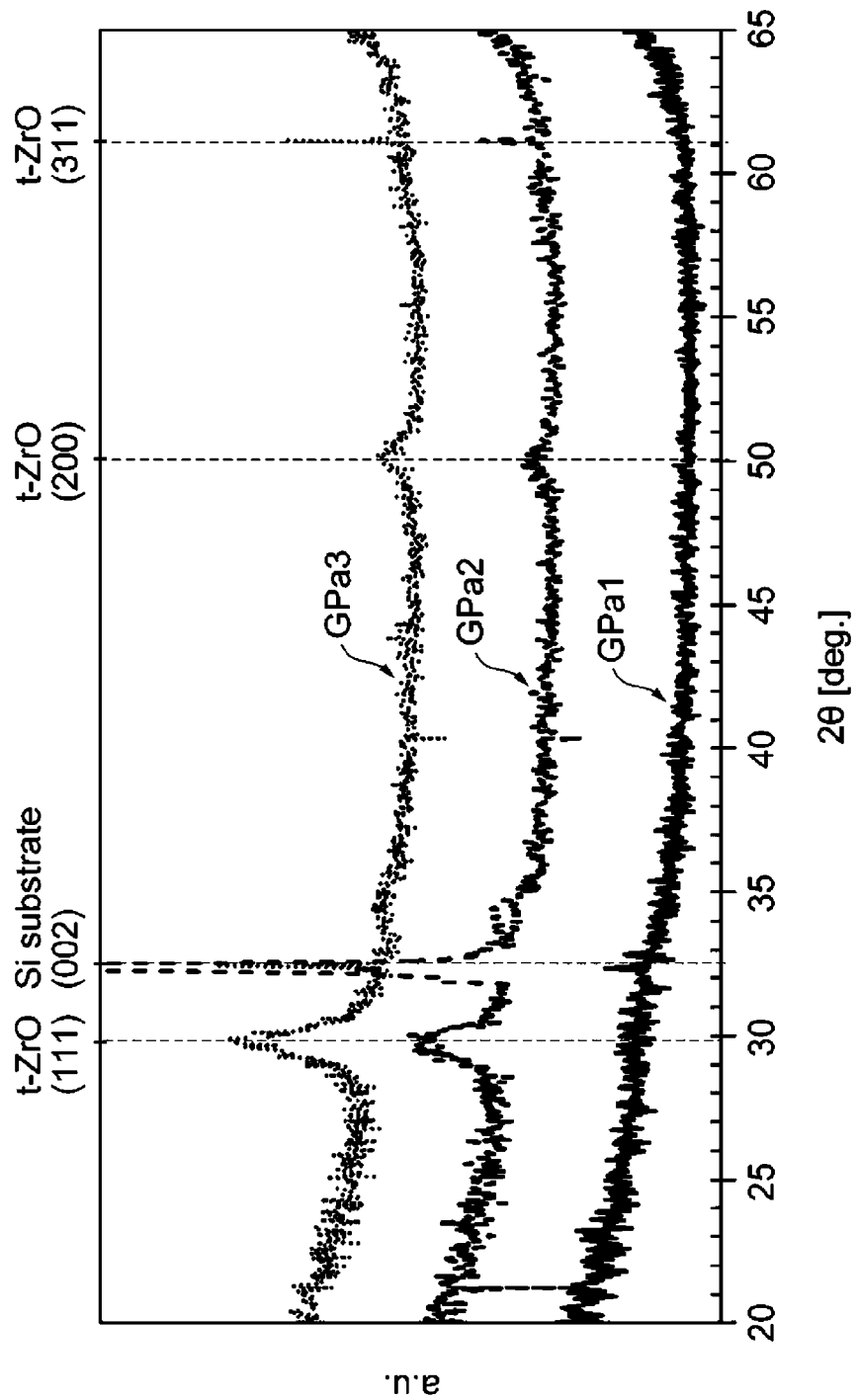
FIG. 5 is a view showing a result obtained by evaluating a second hard mask of a wafer on which the method shown in FIG. 1 is performed.
Figure 6:
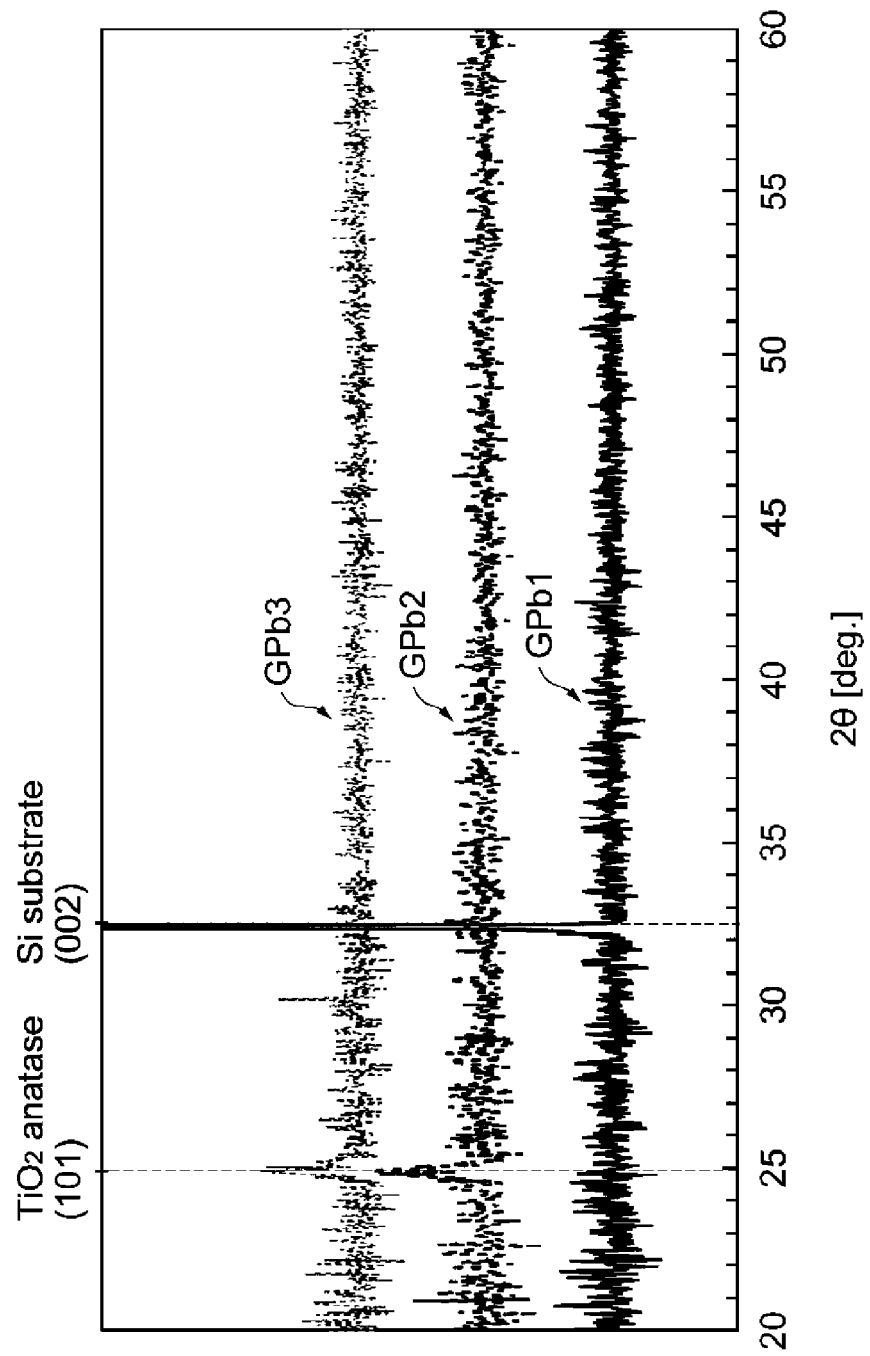
FIG. 6 is a view showing an experimental result obtained by evaluating the second hard mask of the wafer on which the method shown in FIG. 1 is performed.

FIGS. 5 and 6 show the results obtained by this experiment. In the X-ray diffraction method of this experiment, an X-ray diffraction spectrum inside each of the plurality of hard masks was obtained by 2θ-ω scan. In FIGS. 5 and 6, the horizontal axis represents diffraction angle 2θ [deg.], and the vertical axis represents log intensity [a.u.].

FIG. 5 is a graph showing results obtained by thermally treating three zirconium oxide hard masks at different temperatures and then performing analysis based on the X-ray diffraction method. Graphs GPa1, GPa2, and GPa3 in FIG. 5 represent the results of analysis based on the X-ray analysis method when the zirconium oxide hard masks were thermally treated at respective temperatures of 400 degrees Celsius, 500 degrees Celsius, and 580 degrees Celsius.

FIG. 6 is a graph showing results obtained by thermally treating three titanium oxide hard masks at different temperatures and then performing analysis based on the X-ray diffraction method. Graphs GPb1, GPb2, and GPb3 in FIG. 6 represent the results of analysis based on the X-ray analysis method when the titanium oxide hard masks were thermally treated at respective temperatures of 400 degrees Celsius, 500 degrees Celsius, and 580 degrees Celsius.

As shown in FIG. 5, it was confirmed that when the heat treatment temperature was 500 degrees C. or higher, a diffraction peak on the crystal plane was observed and zirconium oxide crystals were present in the hard masks. On the other hand, it was confirmed that when the heat treatment temperature of the hard masks was 400 degrees C., no diffraction peak on the crystal plane was observed and therefore almost no zirconium oxide crystals were present in the hard masks.

Further, as shown in FIG. 6, it was confirmed that when the heat treatment temperature was 500 degrees C. or higher, a diffraction peak on the crystal plane was observed and titanium oxide crystals were present in the hard masks. On the other hand, it was confirmed that when the heat treatment temperature of the hard masks was 400 degrees C., no diffraction peak on the crystal plane was observed and therefore almost no titanium oxide crystals were present in the hard masks.

Next, the results of experiment in which the first hard mask 103 is etched (step ST4) using the second hard mask 104 will be described. In this experiment, step ST4 was performed by forming a hard mask of tungsten silicon film as the first hard mask 103 and forming a hard mask of zirconium oxide, titanium oxide, and silicon oxide as the second hard mask 104. In a comparative example, step ST4 was performed by forming a hard mask of silicon oxide by plasma CVD (PE CVD) using tetraethyl orthosilicate (TEOS) as a raw material gas.

Figure 7:
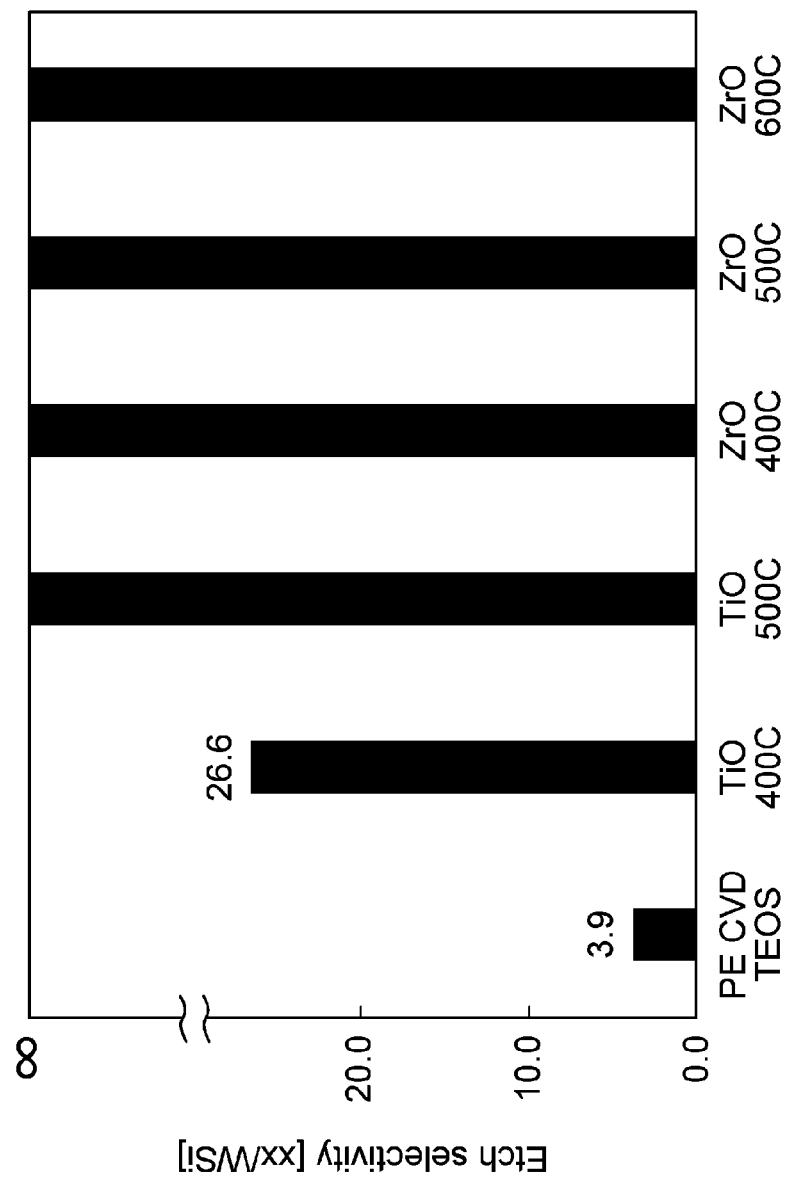
FIG. 7 is a view showing an experimental result obtained by etching a first hard mask with a second hard mask on a wafer on which the method shown in FIG. 1 is performed.

In step ST4, when the first hard mask 103 is etched, the second hard mask 104 is also etched. FIG. 7 shows a calculation result of an etch selectivity which is a ratio between an etched film thickness of the first hard mask 103 and an etched film thickness of the second hard mask 104. Such etched film thicknesses are film thicknesses removed by etching.

The etched film thickness of the first hard mask 103 is represented by EA1. The etched film thickness of the second hard mask 104 is represented by EA2.

The vertical axis in FIG. 7 represents the etch selectivity. This etch selectivity is $EA_1/EA_2$.

As shown in FIG. 7, it was confirmed that after the heat treatment at 400 degrees Celsius or higher, an extremely high etch selectivity was obtained in the second hard mask 104 of either zirconium oxide or titanium oxide as compared with the hard mask of silicon oxide. That is, it was confirmed that the second hard mask 104 of zirconium oxide or titanium oxide has higher resistance to the etching performed in step ST4 than the first hard mask 103 of tungsten silicon. Therefore, when the film thickness of the first hard mask 103 is set to, for example, 400 nm, the film thickness of the second hard mask 104 can be set to about 20 to 30 nm, which makes it possible to make the film thickness of the second hard mask 104 thin.

Accordingly, the shape abnormality of the pattern formed on the first hard mask 103 by etching of the first hard mask 103 may be sufficiently suppressed. Therefore, the shape of the pattern having a high aspect ratio, which is formed on the silicon-containing film 102 by etching of the silicon-containing film 102 under the first hard mask 103, is also sufficiently good because twisting and the like are suppressed.

According to the method MT according to one exemplary embodiment described above, the silicon-containing film is etched using a hard mask in which the first hard mask 103 and the second hard mask 104 are sequentially formed on the silicon-containing film 102. The first hard mask 103 contains tungsten and the second hard mask 104 contains zirconium or titanium. The second hard mask 104 has sufficiently higher etching resistance that that of the first hard mask 103. Therefore, in pattern formation for a hard mask having the first hard mask 103 and the second hard mask 104, the shape abnormality of the pattern is sufficiently suppressed. Accordingly, it is also possible to sufficiently suppress the shape abnormality of the pattern formed on the silicon-containing film 102 by etching of the silicon-containing film 102 using the first hard mask 103, on which the pattern whose shape abnormality is sufficiently suppressed is formed (further, the second hard mask 104). Therefore, even when the pattern formed on the silicon-containing film 102 has a high aspect ratio, twisting and the like may be suppressed so that the pattern may be sufficiently good.

According to the present disclosure in some embodiments, it is possible to provide a technique for etching a silicon-containing film with a high aspect ratio.

Although various exemplary embodiments have been described above, the present disclosure is not limited to the exemplary embodiments described above, and various omissions, substitutions, and changes may be made. In addition, elements in different exemplary embodiments may be combined to form another exemplary embodiment.

From the foregoing, it should be understood that various exemplary embodiments of the present disclosure have been described herein for purposes of illustration, and that various modifications can be made without departing from the scope and spirit of the present disclosure. Accordingly, the various exemplary embodiments disclosed herein are not intended to be limiting, and the true scope and spirit thereof are represented by the appended claims.

What is claimed is:

1. A method of processing a wafer, the method comprising:
preparing a wafer having a substrate and a silicon-containing film formed on the substrate;
forming a hard mask on the silicon-containing film;
forming a carbon-containing film on the hard mask;
forming a patterned hard mask by etching the hard mask using the carbon-containing film as a mask; and
etching the silicon-containing film using the patterned hard mask,
wherein the hard mask has a first film formed on the silicon-containing film and containing tungsten and silicon, and a second film directly formed on the first film and containing zirconium and oxygen, and
wherein, in the forming the patterned hard mask, the first film and the second film have an identical pattern to each other which is transferred onto the silicon-containing film.

2. The method of claim 1, wherein the etching of the silicon-containing film is anisotropic etching using plasma of a fluorocarbon-based gas or plasma of a hydrofluorocarbon-based gas.

3. The method of claim 1, wherein the silicon-containing film is a monolayer film having one of a single crystal silicon film, a polycrystalline silicon film, a silicon oxide film, and a silicon nitride film, or a multilayer film having two or more of the single crystal silicon film, the polycrystalline silicon film, the silicon oxide film, and the silicon nitride.

4. The method of claim 1, wherein the second film has an etching resistance higher than that of the first film.

5. A method of processing a wafer, the method comprising:
preparing a wafer having a substrate and a silicon-containing film formed on the substrate;
forming a first film containing tungsten and silicon on the silicon-containing film;
forming a second film containing zirconium and oxygen directly on the first film;
forming a carbon-containing film on the second film;
forming a patterned second film by etching the second film using the carbon-containing film as a mask;
forming a patterned first film by etching the first film using the second film as a mask; and
etching the silicon-containing film using the patterned first film as a mask,
wherein, in the forming the patterned first film, the first film and the second film have an identical pattern which is transferred onto the silicon-containing film.

6. The method of claim 5, wherein forming the first film includes forming the first film on the silicon-containing film by sputtering.

7. The method of claim 6, wherein forming the second film includes forming the second film on the first film by a coating process.

8. The method of claim 7, wherein the coating process is a spin coating process.

9. The method of claim 8, wherein the etching of the first film is anisotropic etching using plasma of a gas containing halogen atoms.

10. The method of claim 8, wherein a temperature for the film formation of the second film by the spin coating process is set to a temperature range in which the first film and the second film are not crystallized.

11. The method of claim 5, wherein forming the first film includes forming the first film on the silicon-containing film by a chemical vapor deposition method.

12. The method of claim 5, wherein forming the second film includes forming the second film on the first film by a coating process.

13. The method of claim 5, wherein forming the second film includes forming the second film on the first film by a chemical vapor deposition method or an atomic layer deposition method.

14. The method of claim 5, wherein the etching of the first film is anisotropic etching using plasma of a gas containing halogen atoms.

15. The method of claim 5, wherein the etching of the silicon-containing film is anisotropic etching using plasma of a fluorocarbon-based gas or plasma of a hydrofluorocarbon-based gas.

16. The method of claim 5, wherein the silicon-containing film is a monolayer film having one of a single crystal silicon film, a polycrystalline silicon film, a silicon oxide film, and a silicon nitride film, or a multilayer film having two or more of the single crystal silicon film, the polycrystalline silicon film, the silicon oxide film, and the silicon nitride.

17. The method of claim 5, wherein the second film has an etching resistance higher than that of the first film.

* * * * *